United States Patent [19]

Asano et al.

[11] Patent Number: 5,456,764
[45] Date of Patent: Oct. 10, 1995

[54] SOLAR CELL AND A METHOD FOR THE MANUFACTURE THEREOF

[75] Inventors: Akihiko Asano, Zushi; Yukimi Ichikawa, Yokosuka, both of Japan

[73] Assignee: Fuji Electric Co., Ltd., Kawasaki, Japan

[21] Appl. No.: 361,847

[22] Filed: Dec. 21, 1994

Related U.S. Application Data

[63] Continuation of Ser. No. 47,821, Apr. 15, 1993, abandoned.

[30] Foreign Application Priority Data

Apr. 24, 1992 [JP] Japan ................................. 4-105006

[51] Int. Cl.$^6$ ...................... H01L 31/072; H01L 31/20
[52] U.S. Cl. ...................... 136/258; 136/261; 257/51; 257/55; 257/184; 257/431; 257/461; 437/2; 437/4
[58] Field of Search .................. 136/258 AM, 258 PC, 136/261; 257/55, 184, 431, 461, 51; 437/2–5

[56] References Cited

FOREIGN PATENT DOCUMENTS

| | | | |
|---|---|---|---|
| 59-175170 | 10/1984 | Japan | 136/258 |
| 61-242085 | 10/1986 | Japan | 136/258 AM |
| 1-105580 | 4/1989 | Japan | 136/258 |
| 2-82655 | 3/1990 | Japan | 136/258 |
| 3-284881 | 12/1991 | Japan | 136/258 PC |

OTHER PUBLICATIONS

K. Takahashi et al., "Amorphous Silicon Solar Cells", John Wiley & Sons, New York (1986), p. 106.
Ichikawa et al., "12% Two–Stacked a–Si:H Tandem Cells with a New P–Layer Structure", Twenty Second IEEE Photovoltaic Specialists Conference—1991, vol. II, pp. 1296–1301.
Technical Digest, 5th International Photovoltaic Science and Engineering Conference, Nov. 26–30/1990, *Current–Voltage Characteristics of ECR produced n–μc–SIC/p–c–Si Heterojunction Solar Cell*, Y. Matsumoto et al., pp. 692–696.
The Conference Record of The Twenty First IEEE Photovoltaic Specialists Conference–1990, vol. II, May 21–25, 1990, *a–Si/Poly–Si Two–and Four–Terminal Tandem Type Solar Cells*, Y. Matsumoto et al., pp. 1420–1425.
Journal of Applied Physics, vol. 67, No. 10, 15 May 1990, *A new type of high efficiency with a low–cost solar cell having the structure of a μc–SIC/polycrystalline silicon heterojunction*, Y. Matsumoto et al., pp. 6538–6543.
6th International Phtoovoltaic Science and Engineering Conference (PVSEC-6), Feb. 10–14, 1992, *a–Si//poly–Si Four Terminal Stacked Solar Cell Having an Efficiency More than 19%*, W. Ma et al., pp. 463–468.
Amorphous Silicon Photoelectric Conversion Element, 27 E 479, Japanese 61–208878(A), K. Kumano, Sep. 17, 1986.

*Primary Examiner*—Aaron Weisstuch
*Attorney, Agent, or Firm*—Brumbaugh, Graves, Donohue & Raymond

[57] ABSTRACT

Solar cell made using a heterojunction formed from a crystalline silicon layer of a first conductivity type and a hydrogenated amorphous silicon film of a second conductivity type different from the first conductivity type. The hydrogenated amorphous silicon film includes oxygen.

12 Claims, 2 Drawing Sheets

SOLAR CELL AND A METHOD FOR THE MANUFACTURE THEREOF

This application is a continuation of application Ser. No. 08/047,821, filed on Apr. 15, 1993, now abandoned.

BACKGROUND OF THE INVENTION

The present invention relates to a solar cell having a heterojunction formed from a crystalline silicon layer and an oxygen-added hydrogenated amorphous silicon thin film and a method for the manufacture thereof.

Solar light power generation technology is currently being developed with the aim of making solar energy one of the main energy sources of the 21st century. One example of this type of solar light power generation technology is the solar cell. Solar cells which use silicon, the most common semiconductor, as cell material are generally crystalline-based solar cells using single crystal silicon substrates or polycrystalline silicon substrates, as well as thin film-based solar cells such as amorphous silicon solar cells.

Amorphous silicon solar cells are usually low-cost solar cells because of the ease of increasing the cell area through the use of amorphous silicon thin films formed by applying a Chemical Vapor Deposition (CVD) process. However, with these type of cells, the present conversion efficiency is approximately a maximum of 12.5%, an efficiency lower than that of the crystal solar cell. As a matter of fact, the single crystal silicon solar cell has already achieved a conversion efficiency of at least 20%, and even the polycrystalline silicon solar cell has an efficiency of 16% while offering the advantage of using polycrystalline silicon which is cheaper than single crystal silicon.

Solar cells using a polycrystalline silicon substrate in which an n-layer is formed by diffusing phosphorus in to a p-type substrate are already known. However, such diffusion requires heating at elevated temperatures as high as 1000° C. to 1100° C., and the n-layer formed on the rear side must be removed by grinding, thereby causing disadvantages that require heat resistant manufacturing facilities and increased man-hours. The same holds true when single crystal silicon substrates are used.

As a result, a solar cell in which a p-n junction is formed by producing a thin film on a polycrystalline silicon substrate that has a conductivity type different from that of the substrate by means of a CVD process has been developed. Such a solar cell has been reported by H. Okamoto and Y. Hamanaka et al. in, for example, "Proc. 19th IEEE Photov. Spec. Conf., New Orleans (1987)", p. 689, and "Conf. Record 21st IEEE Photov. Spec. Conf., Florida (1990)", p. 1420. A cross-sectional construction of this solar cell is shown conceptually in FIG. 2 of the drawings. In reference to FIG. 2 regarding this type of solar cell, by applying an electron cyclotron resonance (hereinafter abbreviated as ECR) plasma CVD process, a p-n junction was formed by producing a p-type carbon-added hydrogenated micro-crystalline silicon (hereinafter known as µC-SiC:H) thin film 22 with a thickness of 100 nm on an n-type polycrystalline silicon substrate 21 that has a resistivity of 356. cm, measures 5 cm×5 cm, and has a thickness of 0.3 mm. The material gas used in the CVD process was a mixture of $SiH_4$, $B_2H_6$, and $H_2$. The substrate temperature was 300° C., and the microwave power was 300 W. On the back of the polycrystalline silicon substrate, a rear electrode 3 was formed via the vacuum deposition of aluminum. On the surface of the p-layer 22 where the light shines, a transparent electrode 4 with an area of 0.08 $cm^2$ is formed by mask-depositing zinc oxide (ZnO).

The compound, µC-SiC:H, was used in the p-layer 22 to increase the cell output in two ways: 1) by increasing the light transparency resulting from the widened optical band gap, $E_g$, in the p-layer on the side where light enters and, 2) by allowing the greatest possible amount of light to pass through the p-n junction by making the p-layer thinner than the diffusion layer. The output characteristics of a solar cell manufactured in this way was measured under a simulated solar light with an intensity of 100 mW/$cm^2$. The measurement revealed that the open circuit voltage was 0.55 V, the short-circuit current density was 34 mA/$cm^2$ the fill factor was 0 75, and the conversion efficiency was 14%.

It would be desirable to use the ECR plasma CVD process to form the p-type µC-SiC:H thin film when manufacturing the above-described solar cell because the µC-SiC:H thin film cannot be formed through a capacitive-coupling plasma CVD process, which utilizes a high-frequency voltage applied across the counter electrodes and which is suitable for the manufacture of large cells.

The generation of high-density plasma in ECR plasma CVD equipment is based on the following principle: electrons in a plasma, which is induced in a chamber in the magnetic field of a solenoid coil by a microwave guided to the chamber through a wave guide, are accelerated via resonance absorption of the microwave power in performing a cyclotron movement along the lines of the magnetic force, by which the density of the induced plasma becomes higher. Therefore, the available sizes for the solenoid coil and the microwave guide cause the film-formation area to be limited. This limitation makes the present process unsuitable for mass production and the enlargement in size of a heterojunction solar cell using crystalline-based silicon in the form of polycrystals or single crystals, although large substrates for them are available.

It is an object of the present invention to solve the aforementioned problems and provide a solar cell which can be produced in large quantities as well as in large sizes. It is a further object of the present invention to provide a method for manufacture of this type of cell wherein the cell is provided with a heterojunction formed from a crystalline-based silicon base layer and a silicon window layer with wide energy band gap formed thereon by means of a capacitive-coupling plasma CVD process.

SUMMARY OF THE INVENTION

In order to achieve the above objectives, the present invention discloses a solar cell comprising a heterojunction formed from a crystalline silicon layer of a first conductivity type; and a hydrogenated amorphous silicon film of a second conductivity type different from the first conductivity type formed upon the crystalline silicon layer, wherein the amorphous silicon film comprises oxygen.

To be effective the crystalline-based silicon layer of the first conductivity type may be a single crystal silicon substrate, a polycrystalline silicon substrate, or a polycrystalline silicon thin film formed directly on a substrate.

The solar cell of the invention is advantageously made by forming the oxygen-added hydrogenated amorphous silicon thin film via a capacitive-coupling plasma chemical vapor deposition (CVD) process using a mixture of a silicon compound gas, hydrogen gas, and an oxygen source gas as the raw material gas. It is effective to use either $CO_2$, CO, $N_2O$, or a combination thereof as an oxygen-source gas.

In an oxygen-added hydrogenated amorphous silicon material, the band gap $E_g$ increases to within a range of 1.9 eV to 2.0 eV or more as the amount of oxygen added is increased. This decreases the light absorption coefficients so as to increase the photoelectromotive force generated in the heterojunction. Its dark conductivity, which is higher in this case than when carbon-added hydrogenated amorphous silicon materials are used, reduces the internal resistance of the solar cell, and improves the allowable short-circuit current density. Because such a thin film of an oxygen-added hydrogenated amorphous silicon material can be formed via a capacitive-coupling plasma CVD process, it can be laminated uniformly under low temperatures on a large crystalline silicon substrate or on a large polycrystalline silicon thin film.

BRIEF DESCRIPTION OF THE DRAWINGS

The present invention will be described with respect to the drawings, of which.

DETAILED DESCRIPTION OF THE INVENTION

Figure 1:
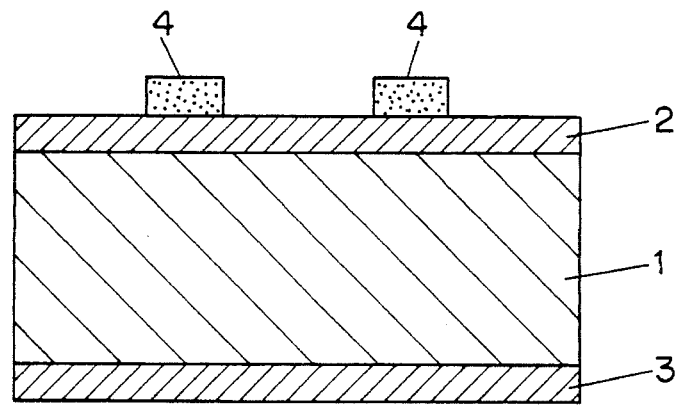
FIG. 1 is a cross section view illustrating the structure of a solar cell using a polycrystalline silicon substrate 1 and an oxygen-added hydrogenated amorphous silicon thin film 2 according to a first embodiment of the present invention.
Figure 2:
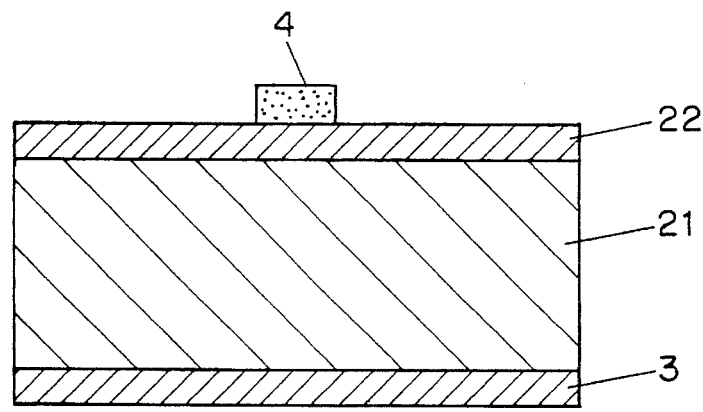
FIG. 2 is a cross section view illustrating the structure of a conventional prior art solar cell using a polycrystalline silicon substrate 21 and a carbon-added hydrogenated micro-crystalline silicon thin film 22.

FIG. 1 shows a cross-section of the construction of a solar cell according to a first embodiment of the present invention. It should be noted that parts of FIG. 1 which are common to those illustrated in FIG. 2 have been assigned the same reference numerals.

In FIG. 1, this solar cell has a heterojunction formed by laminating an n-type oxygen-added hydrogenated amorphous silicon (hereinafter known as a-SiO:H) thin film 2 with a thickness of 100 nm formed on a p-type polycrystalline silicon substrate 1, having a resistivity of 2Ω. cm, measuring 10 cm×10 cm, and having a thickness of 0.35 mm.

Twelve of the a-SiO:H films 2 were simultaneously formed on twelve substrates 1 in capacitive-coupling plasma CVD equipment that included a pair of parallel flat electrodes, each measuring 30 cm×40 cm. A gas mixture of $SiH_4$, $CO_2$, $PH_3$, and $H_2$ was used as the raw material gas. The gas flow rate converted to a rate under normal temperature and pressure was 10 cc per minute for $SiH_4$, 5 cc per minute for $CO_2$, 0.1 cc per minute for $PH_3$, and 200 cc per minute for $H_2$. The substrate temperature was 200° C., the glow discharge power applied to the electrodes was 30 W, and the frequency was 13.56MHz. The dark conductivity in the a-SiO:H thin film formed on a quartz glass substrate under the same conditions was $1.4\times10^{-3}$ S/cm, the light conductivity measured under simulated sunlight with an intensity of 100 mW/cm² was $1.74\times10^{-3}$ S/cm, and the optical band gap, $E_g$, was 2.0 eV.

Previously, it had not been known that an optical band gap as wide as 2.0 eV and a dark conductivity as high as $10^{-3}$ S/cm could be obtained in an a-SiO:H thin film. The formed a-SiO:H thin film contained such a small amount of carbon that the results of analysis therefore via secondary ion mass spectroscopy was $2\times10^{20}$cm$^{-3}$ or 0.4% per atom or less.

Furthermore, an aluminum rear electrode 3 was formed over the entire rear face of the polycrystalline silicon substrate 1 through vacuum deposition, and transparent electrodes 4 were formed on the surface of the a-SiO:H thin film 2 in 1-cm intervals through mask deposition of ZnO in a vacuum.

Thus, twelve manufactured solar cells, measuring 10 cm×10 cm, were respectively split into 9×9 or 81 cells, the output characteristics of which were measured under simulated sunlight at an intensity of 100 mW/cm² by placing the p-layer 2 on the side receiving the sunlight. The average open circuit voltage was 0.60 V, the average short-circuit current density 35 mA/cm², the average fill factor 0.73, and the average conversion efficiency 15.3% . The variation, or standard deviation, in the conversion efficiency was 0.5% as an absolute value, proving that the solar cells had been manufactured with uniform characteristics over an area measuring 30 cm×40 cm.

Figure 3:
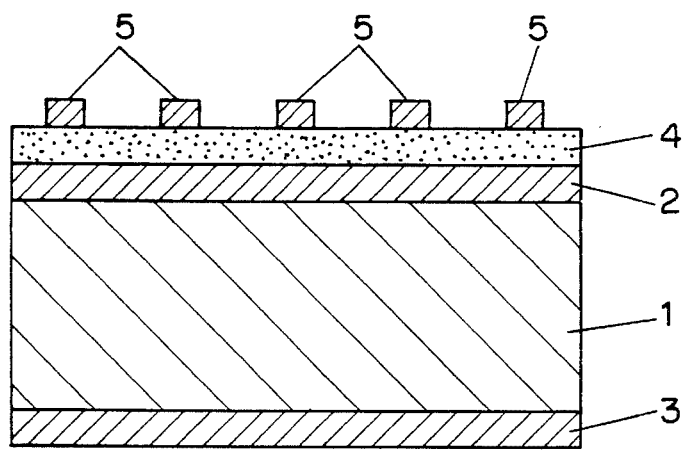
FIG. 3 is a cross section view illustrating the structure of a solar cell using a polycrystalline silicon substrate 1 and oxygen-added hydrogenated amorphous silicon thin film 2 and having aluminum grid-shaped power-collecting electrodes 5 according to a second embodiment of the present invention.

In a second embodiment, solar cells measuring 10 cm×10 cm were manufactured through a similar process. In this case, as shown in FIG. 3, aluminum grid-shaped power-collecting electrodes 5 with a total area of 10 cm² were deposited over the ZnO transparent electrode 4 which was formed on the entire surface of the a-SiO:H thin film 2. The output characteristics of these solar cells in the second embodiment showed an open circuit voltage of 0.58 V, a short-circuit photoelectric current of 3.15 A, a fill factor of 0.71, and a conversion efficiency of 13.0% under simulated sunlight with an intensity of 100 mW/cm².

A reduction in the number of solar cells simultaneously manufactured using this method allows for the production of a cell having a polycrystalline silicon substrate that measures 30 cm×30 cm, which is the largest one currently available. Furthermore, this method also allows for the production of solar cells having the largest currently available single crystal silicon substrates, which measures 10 cm in diameter.

Figure 4:
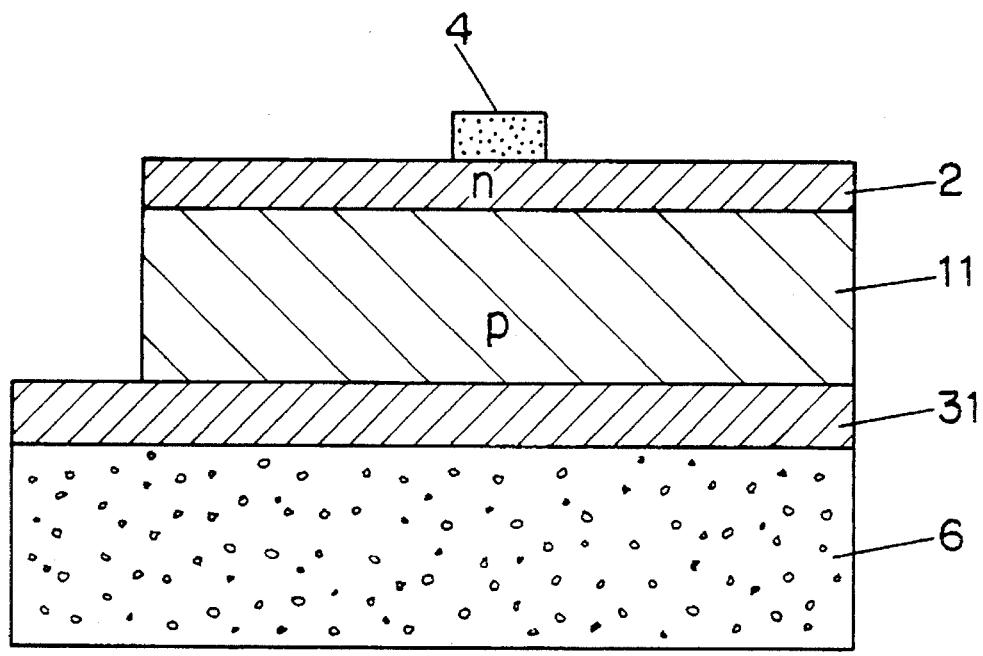
FIG. 4 is a cross section view illustrating the structure of a solar cell using a polycrystalline silicon thin film 11, an oxygen-added hydrogenated amorphous silicon thin film 2 and a quartz glass substrate 6, formed according to a third embodiment of the present invention.

FIG. 4 shows a cross section of a solar cell according to a third embodiment of the present invention, wherein parts common to those shown in FIG. 1 are given the same reference numerals. In this case, a quartz glass substrate 6 measuring 5 cm×5 cm was used, over which a 2 μm thin film made of molybdenum, which has a thermal expansion coefficient close to that of silicon, was deposited to serve as the rear electrode 31. Over this molybdenum rear electrode 31, a p-type polycrystalline silicon thin film 11 was first formed with a thickness of 5 μm using capacitive-coupling plasma CVD equipment and a pair of flat electrodes arranged in parallel. Then, the n-type a-SiO:H thin film 2 was formed to a thickness of 100 nm under the same conditions as those described for the first embodiment. The raw material gas used to form the polycrystalline silicon thin film was a mixture of $SiH_4$, $SiF_4$, and $H_2$. The flow rate converted to a rate under a normal temperature and pressure was 10 cc per minute for $SiH_4$, 100 cc per minute for $SiF_4$, and 100 cc per minute for $H_2$. The substrate temperature was 200° C., and the power of the glow discharge was 50 W. A transparent electrode 4 with an area of 0.08 $cm^2$ was formed over the film by applying mask deposition in a vacuum.

The output characteristics of the thin-film solar cell thus manufactured had an open circuit voltage of 0.50 V, a short circuit photoelectric current density of 25 $mA/cm^2$, a fill factor of 0.55, and a conversion efficiency of 6.9%, under simulated sunlight with an intensity of 100 $mW/cm^2$.

Figure 5:
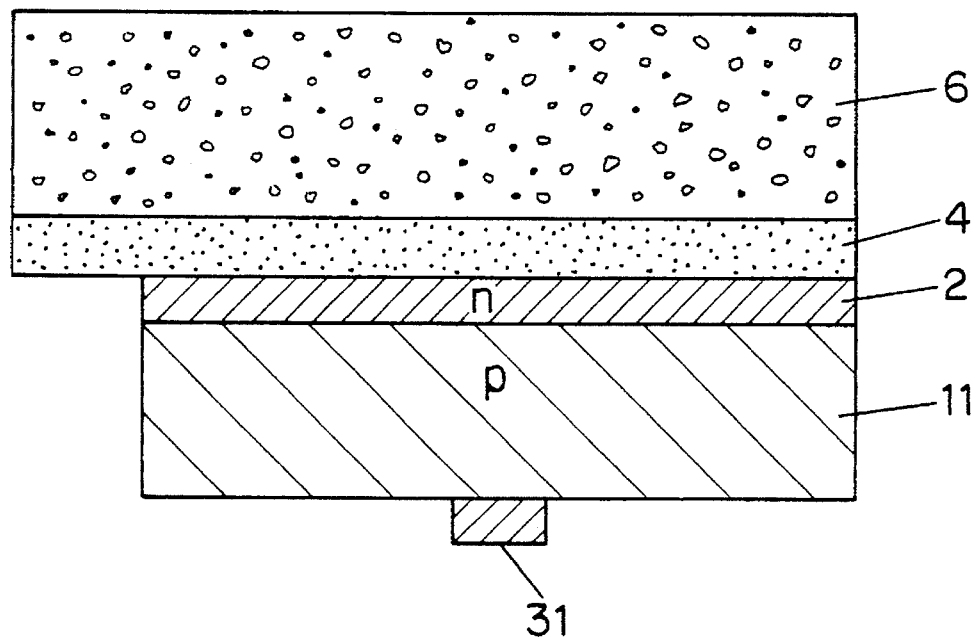
FIG. 5 is a cross section illustrating the structure of a solar cell using a polycrystalline silicon thin film 11 and an oxygen-added hydrogenated amorphous silicon thin film 2 and a quartz glass substrate 6, formed according to a fourth embodiment of the present invention.

In a fourth embodiment, which is shown in FIG. 5, the order of laminating the polycrystalline silicon thin film 11 and the a-SiO:H thin film 2, as described in the third embodiment and as illustrated in FIG. 4, is reversed. In other words, on a quartz glass substrate 6 entirely covered by the transparent electrode 4, a p-type a-SiO:H thin film 2, a p-type polycrystalline silicon thin film 11, and a molybdenum thin film electrode 31 were laminated, in specifically that order. The resulting solar cell also showed the same photoelectric conversion characteristics as those shown by the solar cell illustrated in FIG. 4.

The solar cells of the second and third embodiments offer an advantage in that the film-forming equipment can be simplified because the two types of layers that form the heterojunction can be formed continuously using the same plasma CVD equipment.

According to the present invention, photoelectric conversion is performed by utilizing the heterojunctions between the a-SiO:H thin films and polycrystalline-based silicon layers. The a-SiO:H thin films form window layers with a high transparency due to the wide band gap, and can be formed via a capacitive-coupling plasma CVD process, which can easily produce films over large areas. In accordance with the present invention, the crystalline-based silicon layers can be single-crystalline silicon substrates which are currently being manufactured with an increased diameter, large polycrystalline silicon substrates which are available at a low cost, or polycrystalline silicon thin films, which allow for easy formation over a large area. This makes it possible to obtain solar cells, which have highly transparent window layers and which can be easily produced in an enlarged size as well as in large quantities, such that the conversion efficiency can be improved and the cost of the cells can be reduced.

Furthermore, the plasma discharge power density of the capacitive-coupling plasma CVD process in forming an a-SiO:H film as a wide-band gap window layer material is much lower than that of the ECR plasma CVD process. This reduces the extent of damage and the temperature rise in the crystalline-based silicon substrate, thereby lowering the fault density on the heterojunction interface. Consequently, the lowered fault density ensures another advantage for the present invention in that the cell open voltage is improved to such a degree that it is higher than that of conventional cells.

Although the present invention has been described herein with reference to specific embodiments, many modifications and variations of the invention will readily occur to those skilled in the art. Accordingly, all such variations and modifications are included within the intended scope of the invention.

We claim:

1. A solar cell comprising a heterojunction formed from:
   (a) a crystalline silicon layer of a first conductivity type; and
   (b) a hydrogenated amorphous silicon film of a second conductivity type different from the first conductivity type formed upon the crystalline silicon layer, wherein the hydrogenated amorphous silicon film comprises oxygen; and
   wherein the solar cell is prepared by a process comprising forming the hydrogenated amorphous silicon film on the crystalline silicon layer by capacitive-coupling plasma chemical vapor deposition from a mixture of silicon compound gas, hydrogen gas, and an oxygen-source gas selected from the group consisting of carbon dioxide gas and carbon monoxide gas.

2. The solar cell as claimed in claim 1 further comprising a transparent electrode formed on the hydrogenated amorphous silicon film and a rear electrode formed on the crystalline silicon layer.

3. The solar cell as claimed in claim 1 wherein the crystalline silicon layer of first conductivity type is single crystal silicon, 4. The solar cell as claimed in claim 1 wherein the crystalline silicon layer is polycrystalline silicon.

5. The solar cell as claimed in claim 1, further comprising an insulating substrate on which the heterojunction is disposed.

6. The solar cell as claimed in claim 5 wherein the crystalline silicon layer is disposed between the substrate and the amorphous silicon film.

7. The solar cell as claimed in claim 6, further comprising a transparent electrode disposed on the amorphous silicon film and a second electrode disposed between the substrate and the crystalline silicon layer.

8. The solar cell as claimed in claim 5 wherein the substrate is transparent and the amorphous silicon film is disposed between the crystalline silicon layer and the substrate.

9. The solar cell as claimed in claim 8, further comprising a transparent electrode disposed between the substrate and the amorphous silicon film and a second electrode disposed on the crystalline silicon layer.

10. A method of manufacturing a solar cell having a heterojunction which comprises forming an oxygen-containing hydrogenated amorphous silicon film on a crystalline silicon layer from a mixture of a silicon compound gas, hydrogen gas, and an oxygen-source gas by capacitive-coupling plasma chemical vapor deposition.

11. A method of manufacturing the solar cell as claimed in claim 10 wherein the oxygen-source gas is selected from the group consisting of CO2, CO, and $N_2O$.

12. A solar cell comprising, in sequence:
   (a) a crystalline silicon layer of a first conductivity type having a rear electrode;
   (b) a hydrogenated amorphous silicon film of a second conductivity type different from the first conductivity type formed upon the crystalline silicon layer wherein the hydrogenated amorphous silicon film comprises oxygen;
   (c) a transparent zinc oxide electrode; and
   (d) an aluminum grid-shaped power-collecting electrode.

* * * * *